(12) United States Patent
Wong et al.

(10) Patent No.: US 7,541,857 B1
(45) Date of Patent: Jun. 2, 2009

(54) COMPARATOR OFFSET CANCELLATION ASSISTED BY PLD RESOURCES

(75) Inventors: Wilson Wong, San Francisco, CA (US); Tin H. Lai, San Jose, CA (US); Sergey Shumarayev, San Leandro, CA (US); Rakesh H. Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 156 days.

(21) Appl. No.: 11/323,571

(22) Filed: Dec. 29, 2005

(51) Int. Cl.
*H03L 5/00* (2006.01)
(52) U.S. Cl. .................................. 327/317; 327/30
(58) Field of Classification Search ................ 327/306, 327/331, 317; 326/30, 86
See application file for complete search history.

(56) References Cited

U.S. PATENT DOCUMENTS

| | | | |
|---|---|---|---|
| 4,833,418 A | 5/1989 | Quintus et al. | |
| 5,410,270 A | 4/1995 | Rybicki et al. | |
| 5,631,603 A | 5/1997 | Stubbe et al. | |
| 5,793,230 A | 8/1998 | Chu et al. | |
| 5,982,196 A | 11/1999 | Sever | |
| 6,064,202 A * | 5/2000 | Steiner et al. | 324/251 |
| 6,552,593 B2 | 4/2003 | Blon et al. | |
| 6,762,620 B2 * | 7/2004 | Jang et al. | 326/30 |
| 6,946,882 B2 * | 9/2005 | Gogl et al. | 327/53 |
| 6,980,020 B2 * | 12/2005 | Best et al. | 326/30 |
| 7,301,366 B1 * | 11/2007 | Devnath et al. | 326/30 |
| 2003/0148749 A1 | 8/2003 | Saito | |
| 2003/0151443 A1 | 8/2003 | Kondo et al. | |

* cited by examiner

*Primary Examiner*—Dinh T. Le
(74) *Attorney, Agent, or Firm*—Townsend and Townsend and Crew LLP (57) ABSTRACT

An impedance compensation circuit for inputs of a programmable device includes programmable impedance circuits connected with input nodes. The programmable impedance circuits can be configured to apply a compensating voltages to input nodes to reduce or eliminate unwanted offset voltages. An impedance compensation circuit may include resistors in series or current sources in parallel. A set of bypass switches selectively apply each resistor or current source to an input node, thereby changing the offset voltage of the node and compensating for impedance mismatches. Control logic provides signals to control the bypass switches. The control logic may be implemented using programmable device resources, enabling the control logic to be updated and improved after the manufacturing of the device is complete. The control logic can automatically evaluate offset voltages at any time and change compensating impedances accordingly. This reduces manufacturing costs and takes into account temperature and aging effects.

26 Claims, 6 Drawing Sheets

COMPARATOR OFFSET CANCELLATION ASSISTED BY PLD RESOURCES

CROSS-REFERENCES TO RELATED APPLICATIONS

This application is related to U.S. patent application Ser. No. 11/245,581, filed Oct. 6, 2005, and entitled "Programmable Logic Enabled Dynamic Offset Cancellation" and U.S. patent application Ser. No. 11/323,372, filed Dec. 29, 2005, and entitled "Signal Offset Cancellation," both of which are incorporated by reference herein for all purposes.

BACKGROUND OF THE INVENTION

The present invention relates to the field of programmable devices, and the systems and methods for detecting and compensating for unwanted offset voltages in the same. Programmable devices, such as FPGAs, typically includes thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and memory. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

Programmable devices can include analog comparators, differential amplifiers, and other circuits used to process or compare analog signals. Applications for comparators, differential amplifiers, and other circuits can include analog to digital conversion, signal filtering, and other control and signal processing applications. Ideally, the inputs of comparators and differential amplifiers have balanced, or matching, electrical impedances. Balanced input impedances ensure that the response of a comparator or differential amplifier is not biased towards one of its inputs. Unbalanced or mismatched input impedances can create an unwanted offset voltage at an input of a comparator or differential amplifier. Balanced input impedances also reduce the noise level, increasing the sensitivity and accuracy of the comparator or differential amplifier.

There are two primary sources of impedance mismatches. Systemic impedance mismatches occur when the source of one input signal has a different impedance then the source of the other input signal. Systemic impedance mismatches can be reduced or eliminated through careful system design. Random impedance mismatches may arise from manufacturing variations in devices, temperature changes, and device aging effects. Random impedance mismatches cannot be eliminated by system design.

One prior approach to reducing or eliminating random impedance mismatches is to increase the size of the transistors and other devices forming the comparator or differential amplifier. Typically, the random offset decreases in proportion to the inverse square root of the device area.

Another prior approach to compensating for random impedance mismatches includes an impedance trimming circuit. The impedance trimming circuit includes resistors, current sources, or other components that can be used to deliberately add or subtract impedance from one or more inputs. The impedance trimming circuit includes fuses or other one-time programmable links that can be used to selectively add or subtract impedances from each input. During manufacturing, the input impedances of each device are measured and the appropriate fuses are blown or cut to set corresponding compensating impedances for the inputs. One disadvantage with this approach is that the compensating impedances are fixed for the life of the device, which means random impedance mismatches arising from aging effects or temperature changes cannot be corrected. Additionally, the testing and setting of compensating input impedances adds steps to the manufacturing process, substantially increasing costs.

Another prior approach uses a dedicated impedance compensation circuit that automatically measures and compensates for random impedance mismatches. However, dedicated impedance compensation circuits require substantial time to design correctly. Because the design of the impedance compensation circuit is fixed, the algorithm cannot be updated, improved, or tailored to specific applications or designs. Additionally, dedicated impedance compensation circuits require substantial device area to implement. Programmable devices have to be adaptable to numerous different designs. Many of these designs may not require the use of comparators or differential amplifiers. Thus, the space required for a dedicated impedance compensation circuit is wasted.

It is therefore desirable for programmable devices to include a system and method for automatically compensating for input impedance mismatches to eliminate or reduce unwanted offset voltages. It is further desirable for the system and method to accommodate updates and improvements after the manufacturing of the device is complete, and to allow for tailoring the impedance compensation to specific user designs. It is also desirable for the system and method to be capable of changing the compensating input impedances at any time following the manufacturing of the device to account for aging effects, temperature effects, or any other changes in input impedances over time. It is also desirable for the system of automatically compensating for input impedance mismatches to require minimal space overhead so as to minimize device cost and to not unduly burden user designs that do not require any impedance compensation.

BRIEF SUMMARY OF THE INVENTION

In an embodiment, an impedance compensation circuit for inputs of a programmable device includes programmable impedance circuits connected with input nodes. The programmable impedance circuits can be configured to apply a compensating voltages to input nodes to reduce or eliminate unwanted offset voltages. In an embodiment, an impedance compensation circuit includes a plurality of resistors in series. Each resistor is connected in parallel with a bypass switch. When a bypass switch is open, the corresponding resistor applies additional impedance to the input node. When a bypass switch is closed, the corresponding resistor is short-circuited and does not apply any additional impedance to the input node.

In another embodiment, an impedance compensation circuit includes a plurality of current sources in parallel. Each current source is connected with the input node through a bypass switch. When a bypass switch is closed, the corresponding current source applies additional current to a load resistor connected with the input node. This changes the voltage at the input node. When a bypass switch is opened, the corresponding current source is disconnected from the input node and load resistor.

In an embodiment, the bypass switches are controlled by signals provided by control logic. An embodiment of the control logic can automatically evaluate offset voltages at any time and change compensating impedances accordingly. This eliminates the need for additional manufacturing steps to set compensating impedance values. Additionally, the control logic is capable of changing the compensating input impedances at any time following the manufacturing of the device to account for aging effects, temperature effects, or any other changes in input impedances over time. In an embodiment, the control logic is implemented using programmable device resources. This enables the control logic to be updated and improved after the manufacturing of the device is complete and allows for the tailoring the impedance compensation to specific user designs.

BRIEF DESCRIPTION OF THE DRAWINGS

The invention will be described with reference to the drawings, in which.

DETAILED DESCRIPTION OF THE INVENTION

Figure 1:
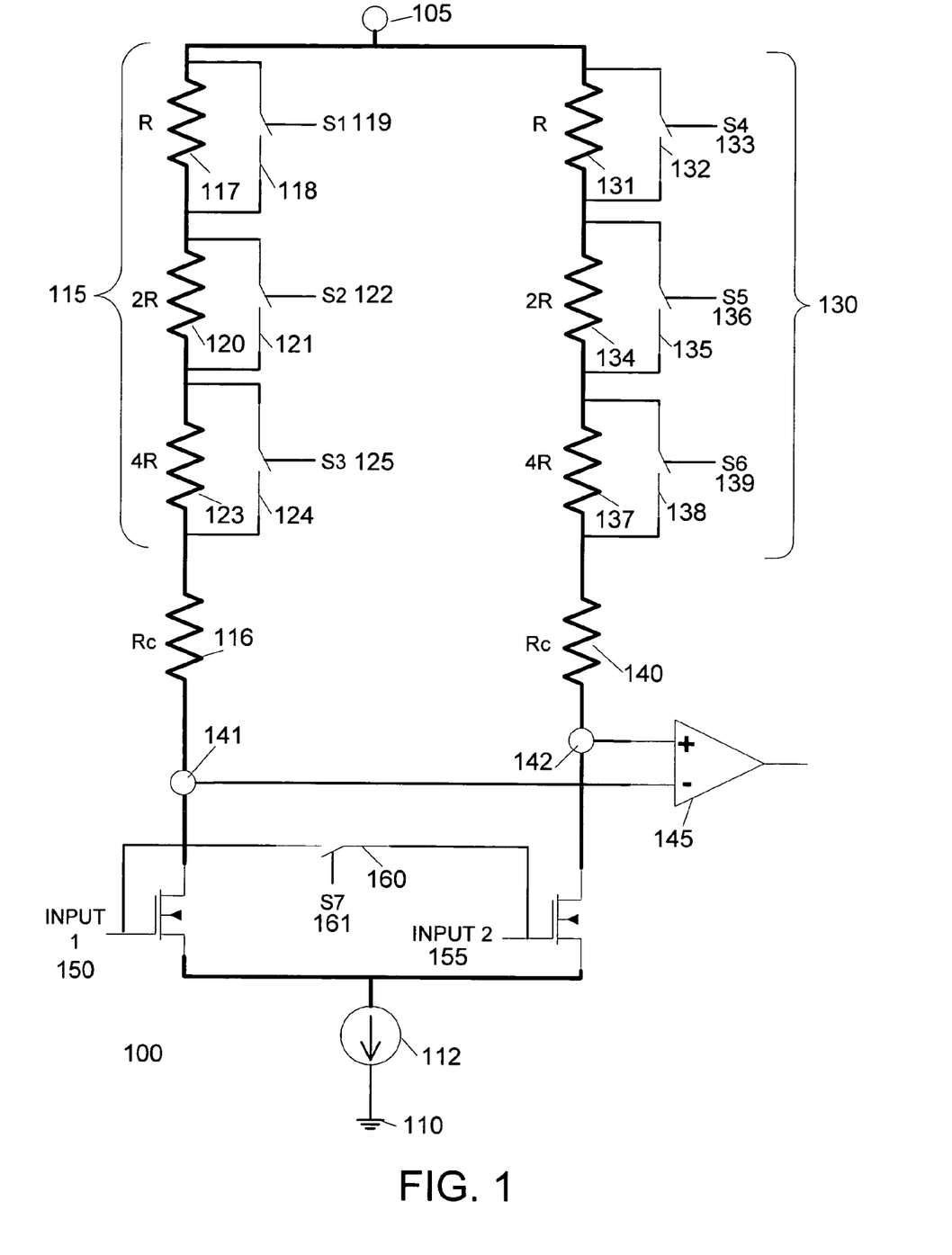
FIG. 1 illustrates an impedance compensation circuit according to an embodiment of the invention.

FIG. 1 illustrates an impedance compensation circuit 100 according to an embodiment of the invention. Impedance compensation circuit 100 is connected with a voltage supply 105 and a ground 110. Current source 112 provides a bias current. Impedance compensation circuit 100 includes first and second inputs 150 and 155 connected with an amplifier or comparator 145. Inputs 150 and 155 are connected with voltage supply 105 via their respective pull-up resistors 116 and 140. Programmable impedance circuit 115 is connected between pull-up resistor 116 and voltage supply 105. In an embodiment, programmable impedance circuit 115 includes a set of resistors, such as resistors 117, 120, and 123. In an embodiment, resistor 120 has a resistance of twice the resistance of resistor 117. Additionally, resistor 123 has a resistance of four times the resistance of resistor 117.

Each resistor of programmable impedance circuit 115 is paired with a bypass switch controlled by a switch input signal. For example, resistors 117, 120, and 123 are paired with bypass switches 118, 121, and 124, respectively. Bypass switches 118, 121, and 124 are controlled by input signals S1 119, S2 122, and S3 125, respectively. In response to its switch input signal, a bypass switch can be closed, thereby short-circuiting the corresponding resistor.

Similarly, programmable impedance circuit 130 is connected between pull-up resistor 140 and voltage supply 105. In an embodiment, programmable impedance circuit 130 includes a set of resistors, such as resistors 131, 134, and 137. In an embodiment, resistor 134 has a resistance of twice the resistance of resistor 131. Additionally, resistor 137 has a resistance of four times the resistance of resistor 134.

Each resistor of programmable impedance circuit 130 is paired with a bypass switch controlled by a switch input signal. For example, resistors 131, 134, and 137 are paired with bypass switches 132, 135, and 138, respectively. Bypass switches 132, 135, and 138 are controlled by input signals S4 133, S5 136, and S6 139, respectively.

By selectively activating the bypass switches 119, 122, and 125, the impedance of this embodiment of the programmable impedance circuit 115 can be changed from 0 to 7R in increments of R, where R is the resistance of resistor 117. Similarly, bypass switches 132, 135, and 138 can be used to vary the impedance of this embodiment of programmable impedance circuit 130 from 0 to 7R in increments of R, where R is the resistance of resistor 131. As the impedance of programmable impedance circuits 115 or 130 increase, the voltage at nodes 141 or 142, respectively, decreases.

In alternative embodiments, the resistance values and the number of resistors in programmable impedance circuits 115 and 130 can be varied to provide a larger range of impedance values, smaller increments of impedance, and/or linear or non-linear coverage of an impedance range.

Additionally, bypass switch 160 is controlled by input signal S7 161. In response to input signal S7 161, bypass switch 160 short-circuits inputs 150 and 155. As discussed in detail below, this facilitates the determination of appropriate impedance values for programmable impedance circuits 115 and 130.

In an embodiment, input signals S1 119, S2 122, S3 125, S4 133, S5 136, S6 139, and S7 161 are provided by control logic implemented using programmable device resources. The control logic can implement an automatic impedance matching algorithm. This has the advantage of eliminating the need for extra testing and impedance setting steps during manufacturing, reducing manufacturing costs. Moreover, the control logic can automatically adjust the impedance as many times as needed over the life of the programmable device, thereby taking into account aging and other time varying effects on random impedance. The control logic can automatically adjust the impedance following device events, such as after the device is reset. Because the control logic is implemented in programmable device resources, the impedance matching algorithm can be updated or refined as needed. Furthermore, impedance matching algorithms can be tailored to specific programmable device designs. Additionally, programmable device designs that do not require any impedance matching may omit this control logic, saving area and other programmable device resources.

Figure 2:
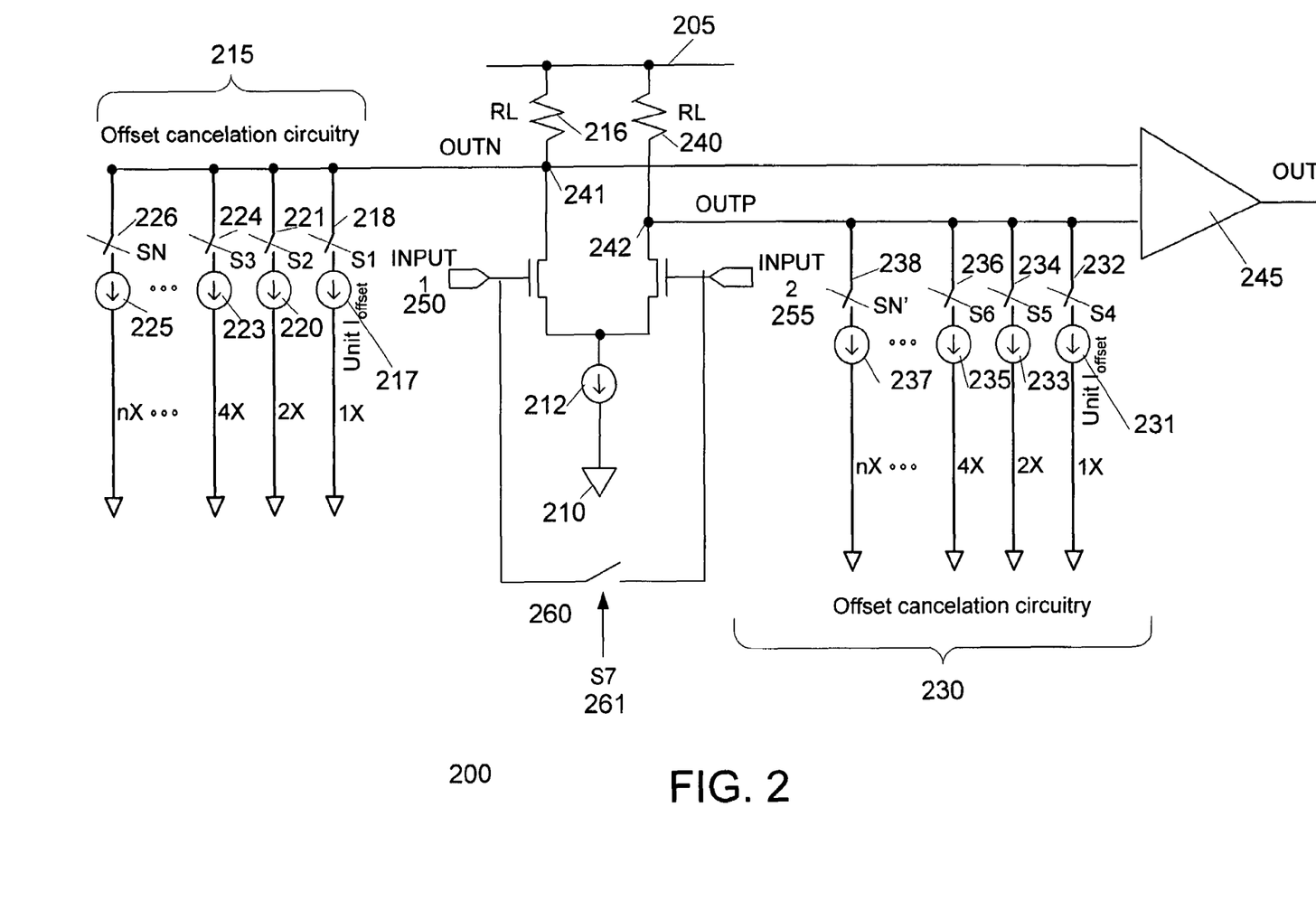
FIG. 2 illustrates an impedance compensation circuit according to another embodiment of the invention.

FIG. 2 illustrates an impedance compensation circuit 200 according to another embodiment of the invention. Impedance compensation circuit 200 operates in a similar manner as circuit 100, with the programmable impedance circuits being replaced with programmable current sources. Impedance compensation circuit 200 is connected with a voltage supply 205 and a ground 210. Current source 212 provides a bias current. Impedance compensation circuit 200 includes first and second inputs 250 and 255 connected with an amplifier or comparator 245. Inputs 250 and 255 are connected with voltage supply 205 via their respective pull-up resistors 216 and 240.

Programmable current source 215 is connected between pull-up resistor 216 and ground 210. In an embodiment, programmable current source 215 includes a set of current sources, such as current sources 217, 220, 223, and 225. In an embodiment, current source 220 provides a current twice that of current source 217. Additionally, current source 223 provides a current four times that of the current source 217.

Each current source of programmable current source 215 is paired with a bypass switch controlled by a switch input signal. For example, current sources 217, 220, and 223 are paired with bypass switches 218, 221, and 224, respectively.

Bypass switches 218, 221, and 224 are controlled by input signals S1, S2, and S3, respectively. In response to its switch input signal, a bypass switch can be closed, thereby connecting its respective current source with the pull-up resistor 216.

Similarly, programmable current source 230 is connected between pull-up resistor 240 and ground 210. In an embodiment, programmable current source 230 includes a set of current sources including current sources 231, 233, 235, and 237. In an embodiment, current source 233 provides a current twice that of current source 231. Additionally, current source 235 provides a current four times that of the current source 231.

Each current source of programmable impedance circuit 230 is paired with a bypass switch controlled by a switch input signal. For example, current sources 231, 233, 235, and 237 are paired with bypass switches 232, 234, 236, and 238, respectively. Bypass switches 232, 234, and 236 are controlled by input signals S4, S5, and S6, respectively.

By selectively activating the bypass switches 218, 221, 224, and 226, the additional current provided by this embodiment of the programmable current source 215 can be changed from 0 to $2^{N-1}-1\times I$ in increments of I, where I is the current supplied by current source 217 and N is the total number of current sources in programmable current source 215. Similarly, bypass switches 232, 234, 236, and 138 can be used to vary the additional current provided by this embodiment of programmable impedance circuit 230 from 0 to $2^{N-1}-1\times I$ in increments of I, where I is the current supplied by current source 231 and N is the total number of current sources in programmable current source 230. As the current provided by programmable current sources 215 and 230 increases, the voltages at nodes 241 and 242, respectively, decrease.

In alternative embodiments, the current source values and the number of current sources in programmable current sources 215 and 230 can be varied to provide a larger range of current values, smaller increments of currents, and/or linear or non-linear coverage of a current range.

Additionally, bypass switch 260 is controlled by input signal S7. In response to input signal S7, bypass switch 260 short-circuits inputs 250 and 255. As discussed in detail below, this facilitates the determination of appropriate current values for programmable current sources 215 and 230.

In an embodiment of circuit 200, input signals S1, S2, S3, S4, S5, S6, and S7 are provided by control logic implemented using programmable device resources. The control logic can implement an automatic impedance matching algorithm.

Figure 3:
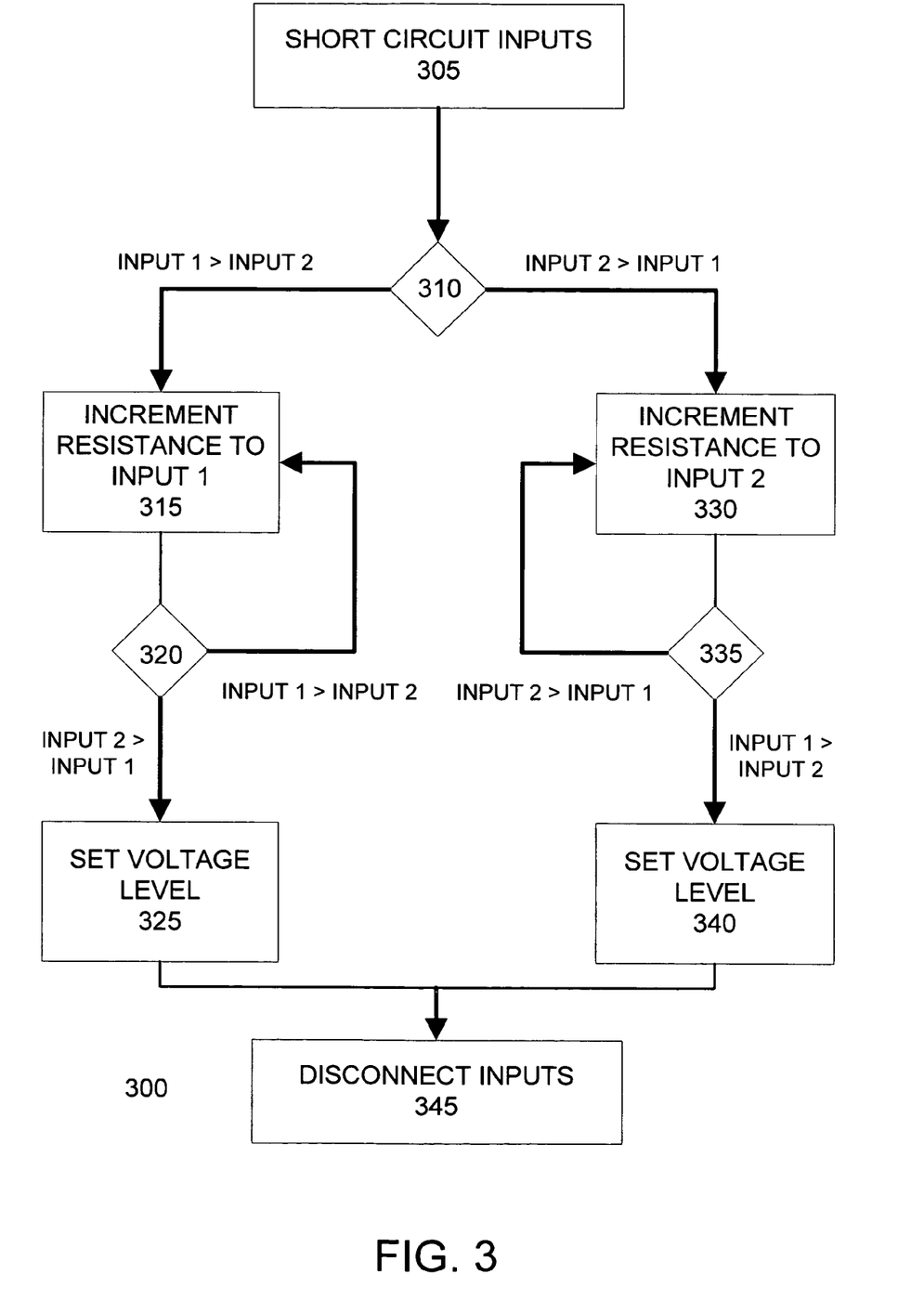
FIG. 3 illustrates a method of operation for an impedance compensation circuit according to an embodiment of the invention.

FIG. 3 illustrates a method 300 of operation for an impedance compensation circuit according to an embodiment of the invention. Step 305 of method 300 short circuits the two inputs of the comparator or differential amplifier circuit. In an embodiment, step 305 closes a switch such as switch 160 or 260 as described above. Ideally, the result of step 305 should be to equalize the voltages at nodes 141 and 142, or at 241 and 242. However, due to random impedance mismatches and other variations in the programmable device, the voltage at one of these nodes will be higher than at the other node. As a result, the comparator or amplifier 145 or 245 will erroneously perceive one of the input voltages to be higher than the other.

Decision block 310 evaluates the input voltages perceived by the amplifier or comparator. If the voltage at input 1 is perceived to be greater than the voltage at input 2, method 300 proceeds to step 315. Conversely, if the voltage at input 2 is perceived to be greater than the voltage at input 1, method 300 proceeds to step 330.

Step 315 decreases the perceived voltage of input 1. In an embodiment, step 315 increases the impedance of a programmable impedance circuit 115, which in turn lowers the voltage at a node 141 connected with an input of comparator or amplifier 145. In another embodiment, step 315 increases the current provided by a programmable current source 215, which lowers the voltage at a node 241 connected with an input of comparator or amplifier 245. Further embodiments of step 315 can perform similar manipulations of programmable voltage, current, or impedance sources connected directly or indirectly with a voltage supply or ground.

Decision block 320 evaluates the input voltages perceived by the amplifier or comparator. If the voltage at input 1 is still greater than the voltage at input 2, method 300 proceeds back to step 315. Steps 315 and 320 may be repeated as often as necessary until the perceived voltage at input 2 is greater than or equal to the voltage perceived at input 1.

When decision block 320 determines that the perceived voltage at input 2 is greater than or equal to the voltage perceived at input 1, method 300 proceeds to step 325. In an embodiment, this is indicated by a change in polarity or output state of a voltage comparator. Step 325 sets the signal values for the bypass switches, which sets the voltage levels for the inputs. In an embodiment, the voltage level is set according to the most recent value used for the programmable impedance circuit or programmable current source. In another embodiment, the voltage level is set according the prior value used for the programmable impedance circuit or programmable current source. Following step 325, method 300 proceeds to step 345.

Returning to decision block 310, if the voltage at input 2 is perceived to be greater than the voltage at input 1, method 300 proceeds to step 330. Steps 330, 335, and 340 are similar to steps 315, 320, and 325, respectively.

Step 330 decreases the perceived voltage of input 2. In an embodiment, step 330 increases the impedance of a programmable impedance circuit 130, which in turn lowers the voltage at a node 142 connected with an input of comparator or amplifier 145. In another embodiment, step 330 increases the current provided by a programmable current source 230, which lowers the voltage at a node 242 connected with an input of comparator or amplifier 245. Further embodiments of step 330 can perform similar manipulations of programmable voltage, current, or impedance sources connected directly or indirectly with a voltage supply or ground.

Decision block 335 evaluates the input voltages perceived by the amplifier or comparator. If the voltage at input 2 is still greater than the voltage at input 1, method 300 proceeds back to step 330. Steps 330 and 335 may be repeated as often as necessary until the perceived voltage at input 1 is greater than or equal to the voltage perceived at input 2.

When decision block 335 determines that the perceived voltage at input 1 is greater than or equal to the voltage perceived at input 2, method 300 proceeds to step 340. In an embodiment, this is indicated by a change in polarity or output state of a voltage comparator. Step 340 sets the voltage level for the inputs. In an embodiment, the voltage level is set according to the most recent value used for the programmable impedance circuit or programmable current source. In another embodiment, the voltage level is set according the prior value used for the programmable impedance circuit or programmable current source. Following step 340, method 300 proceeds to step 345.

Step 340 disconnects the two inputs of the comparator or differential amplifier circuit. In an embodiment, step 340 opens a switch such as switch 160 or 260 as described above. This breaks the connection between the two inputs, allowing them to assume different voltage values.

Method 300 is an example of one automatic impedance compensation algorithm. Other impedance compensation algorithms can be utilized with circuits 100 or 200. As discussed above, the control logic implementing method 300 or any other impedance compensation algorithm can be implemented using programmable device resources. For example, a state machine implementing method 300 can be implemented using programmable device resources. Because the control logic is implemented in programmable device resources, the impedance matching algorithm can be updated or refined as needed. Furthermore, impedance matching algorithms can be tailored to specific programmable device designs.

Figure 4:
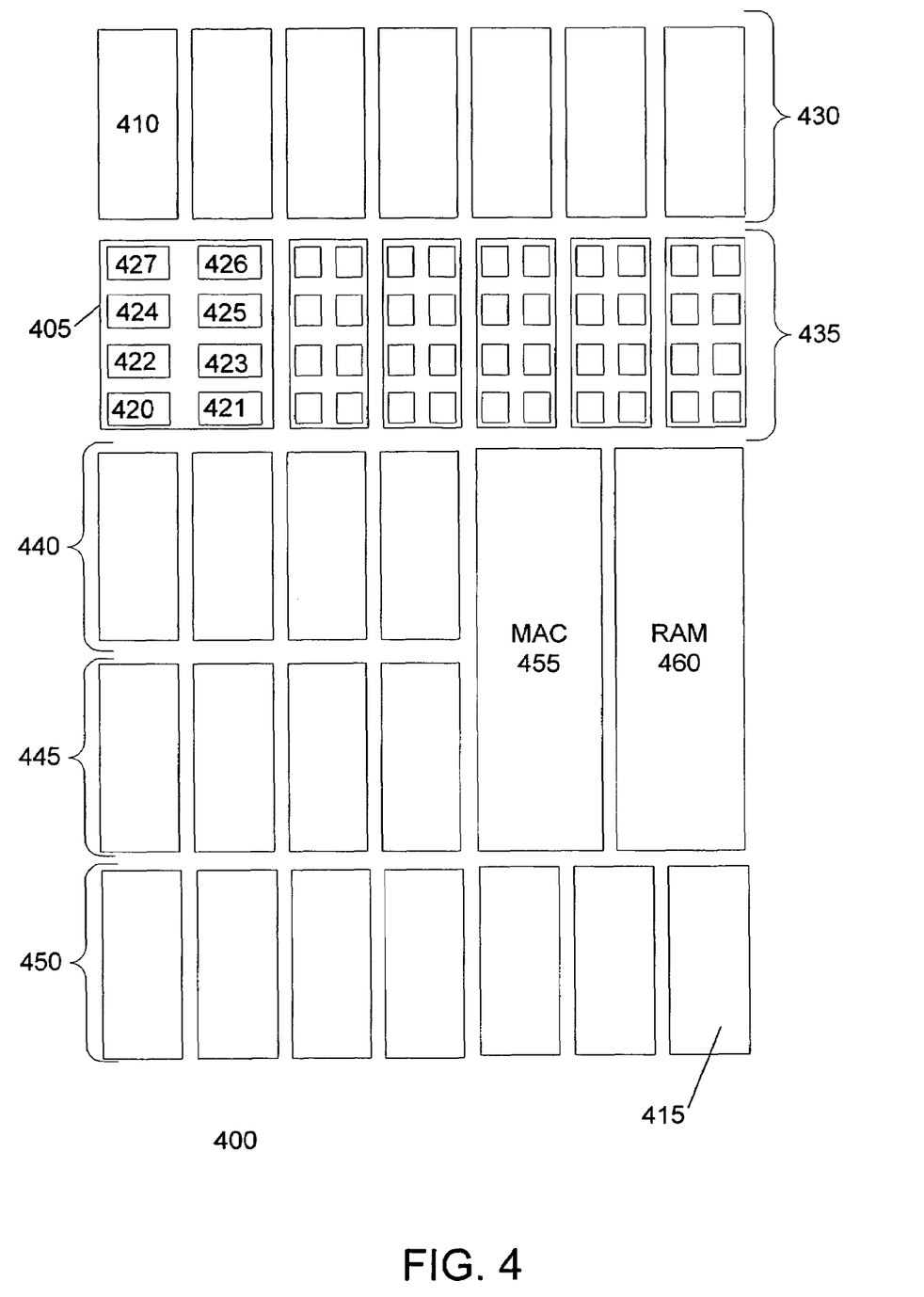
FIG. 4 illustrates an example programmable device suitable for implementing an embodiment of the invention.

FIG. 4 illustrates an example programmable device 400 Programmable device 400 includes a number of logic array blocks (LABs), such as LABs 405, 410, 415. Each LAB includes a number of programmable logic cells using logic gates and/or look-up tables to perform logic operations, as well as registers to store and retrieve data. LAB 405 illustrates in detail logic cells 420, 421, 422, 423, 424, 425, 426, and 427. Logic cells are omitted from other LABs in FIG. 4 for clarity. The LABs of device 400 are arranged into rows 430, 435, 440, 445, and 450. In an embodiment, the arrangement of logic cells within a LAB and of LABs within rows provides a hierarchical system of configurable connections of a programmable switching circuit, in which connections between logic cells within a LAB, between cells in different LABs in the same row, and between cell in LABs in different rows require progressively more resources and operate less efficiently.

In addition to logic cells arranged in LABs, programmable device 400 also include specialized functional blocks, such as multiply and accumulate block (MAC) 455 and random access memory block (RAM) 460. The configuration of the programmable device is specified at least in part by configuration data stored in configuration memory 475. The configuration data can include values for lookup tables defining the functions of logic cells; values of control signals for multiplexers and other switching devices used by the configurable switching circuit to route signals between inputs, outputs, logic cells, and functional blocks; and values specifying other aspects of the configuration of the programmable device, such as modes of operation of the programmable device and its assorted functional blocks and logic cells. Although the configuration memory 475 is shown in FIG. 4 as a monolithic unit, in some programmable devices, configuration memory 475 is scattered all over the programmable device. In these types of programmable devices, portions of the configuration memory can lie within the logic cells, functional blocks, and configurable switching circuit of the programmable device.

For clarity, the portion of the programmable device 400 shown in FIG. 4 only includes a small number of logic cells, LABs, and functional blocks. Typical programmable devices will include thousands or tens of thousands of these elements.

Figure 5A:
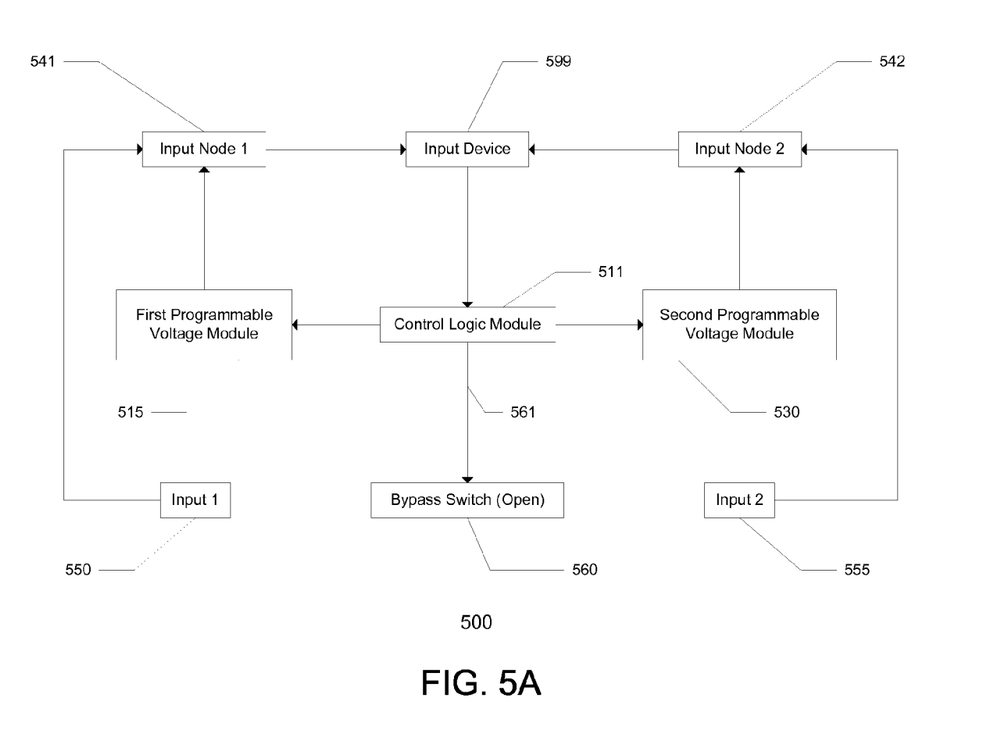
FIGS. 5A and 5B illustrate block diagrams of a programmable device according to an embodiment of the invention.
Figure 5B:
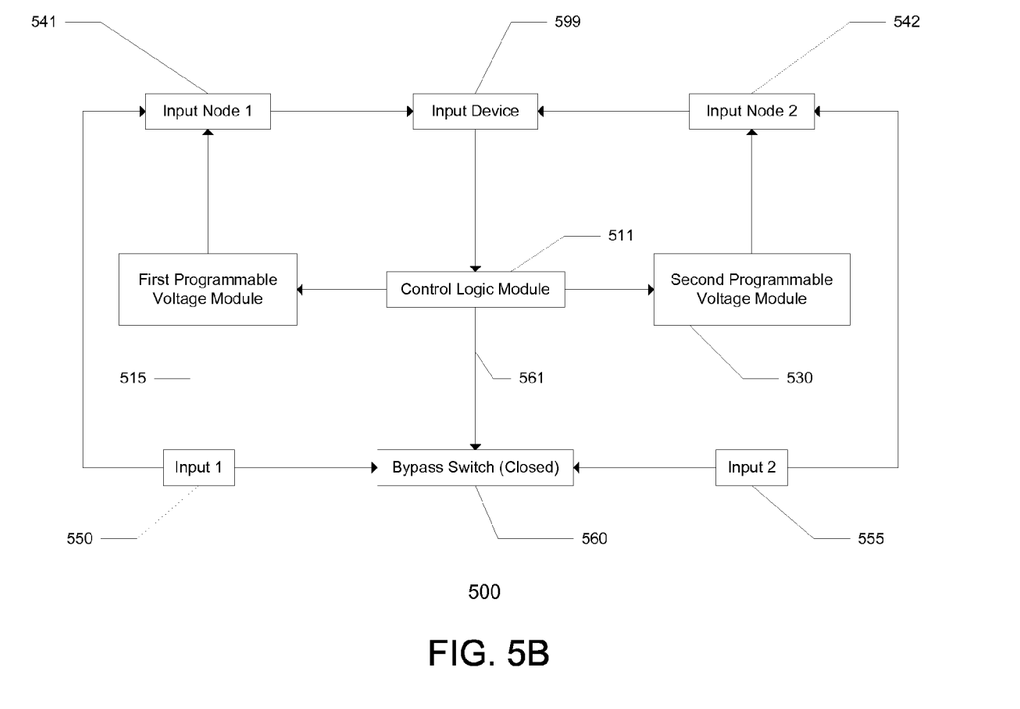

FIG. 5A illustrates a block diagram of a programmable device 500 according to an embodiment of the invention, wherein a bypass switch 560 is in an open state. FIG. 5B illustrates a block diagram of the programmable device 500 according to an embodiment of the invention, wherein the bypass switch 560 is in a closed state. Programmable device 500 includes input 1 550 and input 2 555. Programmable device 500 includes input node 1 541 and input node. Programmable device 500 includes a first programmable voltage module 515 and a second programmable voltage module 530. Programmable device 500 includes a control logic module 511 implemented in programmable resources of the programmable device. Programmable device 500 includes a comparing means 599. Programmable device 500 includes the bypass switch 560 connected to the control logic module 511 via signal 561.

Further embodiments can be envisioned to one of ordinary skill in the art after reading the attached documents. For example, although the invention has been discussed with reference to programmable devices, it is equally applicable to performance visualization applications used to analyze any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A programmable device comprising:
   a first input node having a first voltage value responsive to at least a first input voltage, wherein the first input node is connected with an input device;
   a second input node having a second voltage value responsive to at least a second input voltage, wherein the second input node is connected with the input device;
   a first programmable voltage module connected with the first input node,
      wherein the first programmable voltage module is adapted to provide a first compensating voltage to the first input node,
      wherein the first programmable voltage module includes a plurality of resistors, wherein each resistor is connected in parallel with a resistor bypass switch adapted to selectively short-circuit its associated resistor in response to a portion of a first signal;
   a second programmable voltage module connected with the second input node, wherein the second programmable voltage module is adapted to provide a second compensating voltage to the second input node; and
   a plurality of programmable logic resources adapted to implement functions of a logic circuit and to evaluate the first and second voltage values, wherein the functions include providing the first signal to the first programmable voltage module and providing a second signal to the second programmable voltage module, wherein the first and second signals specify values for the first and second compensating voltages.

2. The programmable device of claim 1, wherein the first programmable voltage module is adapted to provide a pull-up impedance, specified by the first signal, to the first input node and the second programmable voltage module is adapted to provide a pull-up impedance, specified by the second signal, to the second input node.

3. The programmable device of claim 1, wherein the first programmable voltage module is adapted to provide a current specified by the first signal through a load resistor connected with the first input node and the second programmable voltage module is adapted to provide a current specified by the second signal through a load resistor connected with the second input node.

4. The programmable device of claim 1, wherein the functions of the logic circuit include automatically determining values for the first and second compensating voltages to compensate for random impedance mismatches between the first and second input nodes.

5. The programmable device of claim 4, wherein the logic circuit includes logic adapted to perform the steps of:
   providing a third signal to close a first bypass switch to equalize first and second input voltages;
   measuring a first output value of the input device, wherein the first output value of the input device is based on a difference between voltages of the first and second input nodes;
   providing the first signal to the first programmable voltage module in response to a determination from the first output value that the voltage of the first input node is greater than the voltage of the second input node, wherein the first signal is adapted to increment the first compensating voltage applied to the first input node;
   providing the second signal to a second programmable voltage module connected with the second input node in response to a determination from the first output value that the voltage of the first input node is less than the voltage of the second input node, wherein the second signal is adapted to increment the second compensating voltage applied to the second input node;
   measuring a second output value of the input device;
   setting the first and second signals to optimal values in response to a determination from the second output value that the difference between the voltages of the first and second input nodes has been minimized; and
   setting the third signal to enable the first and second input voltages to be independent.

6. The programmable device of claim 5, wherein the logic circuit further includes logic adapted to perform the steps of:
   repeating the step of providing the first signal to the first programmable voltage module to further increment the first compensating voltage in response to a determination from the second output value that the voltage of the first input node is greater than the voltage of the second input node; and
   repeating the step of providing the second signal to the second programmable voltage module to further increment the second compensating voltage in response to a determination from the second output value that the voltage of the first input node is less than the voltage of the second input node.

7. The programmable device of claim 5, wherein the logic circuit is further adapted to detect a change in polarity between the first and second output values, wherein the change in polarity indicates that the difference between the voltages of the first and second input nodes has been minimized.

8. The programmable device of claim 1, wherein the input device includes a voltage comparator.

9. The programmable device of claim 1, wherein the input device includes a differential amplifier.

10. A circuit for compensating for impedance mismatch in a programmable device inputs, the circuit comprising:
   a first input node having a first voltage value responsive to at least a first input voltage, wherein the first input node is connected with an input device;
   a second input node having a second voltage value responsive to at least a second input voltage, wherein the second input node is connected with the input device;
   a first programmable voltage module connected with the first input node, wherein the first programmable voltage module is adapted to provide a first compensating voltage to the first input node;
   a second programmable voltage module connected with the second input node, wherein the second programmable voltage module is adapted to provide a second compensating voltage to the second input node;
   a control logic module implemented in programmable resources of the programmable device and connected with the first and second programmable voltage modules, wherein the control logic module is adapted to evaluate the first and second voltage values, to provide at least one first signal to the first programmable voltage module, and to provide at least one second signal to the second programmable voltage module, and wherein the first and second signals specify values for the first and second compensating voltages;
   a bypass switch responsive to a third control signal provided by the control logic module and adapted to equalize the first and second input voltages;
   a first transistor having a source/drain connected with the first input node and having a gate connected with the first input voltage; and
   a second transistor having a source/drain connected with the second input node and having a gate connected with the second input voltage.

11. The circuit of claim 10, wherein the first programmable voltage module includes a plurality of resistors, wherein each resistor is associated with a bypass switch adapted to selectively short-circuit its associated resistor in response to a portion of the first signal.

12. The circuit of claim 11, wherein the plurality of resistors includes a first resistor having a first resistance value, a second resistor having a second resistance value twice that of the first resistance value, and a third resistor having a third resistance value four times that of the first resistance value.

13. The circuit of claim 10, wherein the first programmable voltage module is adapted to provide an impedance specified by the first signal.

14. The circuit of claim 13, wherein the first programmable voltage module is adapted to provide a pull-up impedance to the first input node.

15. The circuit of claim 10, wherein the second programmable voltage module is adapted to provide an impedance specified by the second signal.

16. The circuit of claim 15, wherein the second programmable voltage module is adapted to provide a pull-up impedance to the second input node.

17. The circuit of claim 10, wherein the control logic module is adapted to automatically determine values for the first and second compensating voltages to compensate for random impedance mismatches between the first and second input nodes.

18. The circuit of claim 17, wherein the control logic module is connected with an output of the input device, the output being used in determining the values for the first and second compensating voltages.

19. The circuit of claim 10, wherein the first programmable voltage module includes a plurality of current sources and a load resistor, wherein each current source is associated with a bypass switch adapted to selectively disconnect its associated current source in response to a portion of the first signal.

20. The circuit of claim 19, wherein the plurality of current sources includes a first current source having a first current value, a second current source having a second current value twice that of the first current value, and a third current source having a third current value four times that of the first current value.

21. The circuit of claim 10, wherein the first programmable voltage module is adapted to provide a current specified by the first signal through a load resistor connected with the first input node.

22. The circuit of claim 10, wherein the second programmable voltage module is adapted to provide a current specified by the second signal through a load resistor connected with the second input node.

23. The circuit of claim 10, wherein the input device includes a voltage comparator.

24. The circuit of claim 10, wherein the input device includes a differential amplifier.

25. The circuit of claim 10, wherein the control logic is adapted to automatically determine values for the first and second compensating voltages to compensate for random impedance mismatches between the first and second input nodes following a reset of the programmable device.

26. A programmable device comprising:
a first programmable voltage module,
  wherein the first programmable voltage module is adapted to provide a first compensating voltage to a first input node, and
  wherein the first programmable voltage module includes a plurality of resistors, wherein each resistor is connected in parallel with a resistor bypass switch adapted to selectively short-circuit its associated resistor in response to a portion of a first signal;
a second programmable voltage module connected with a second input node, wherein the second programmable voltage module is adapted to provide a second compensating voltage to the second input node; and
a plurality of programmable logic resources adapted to evaluate voltages at the first node and the second node and adapted to provide the first signal to the first programmable voltage module and a second signal to the second programmable voltage module.

* * * * *